United States Patent [19]
Yamashita

[11] Patent Number: 5,111,293
[45] Date of Patent: May 5, 1992

[54] PREDICTIVE CODING DEVICE HAVING A SAMPLING MEANS AND A PREDICTIVE CODING MEANS

[75] Inventor: Shinichi Yamashita, Yokohama, Japan

[73] Assignee: Canon Kabushiki Kaisha, Tokyo, Japan

[21] Appl. No.: 498,435

[22] Filed: Mar. 26, 1990

[30] Foreign Application Priority Data

Mar. 28, 1989 [JP] Japan .................................. 1-073937
Mar. 28, 1989 [JP] Japan .................................. 1-073938
Mar. 28, 1989 [JP] Japan .................................. 1-073939

[51] Int. Cl.⁵ ............................................. H04N 7/13
[52] U.S. Cl. ..................................... 358/135; 358/138
[58] Field of Search ................. 358/135, 138, 133, 136

[56] References Cited

U.S. PATENT DOCUMENTS 4,742,391  5/1988  Sorgi et al.
4,843,465  6/1989  Yuasa et al. ................... 358/135 X
4,893,467  6/1989  Reimann ........................ 358/135

OTHER PUBLICATIONS

BBC Research Department Report, No. 16, Tadworth GB, pp. 1-25. J. H. Scott, "Digital Video Bit-Rate Reduction: DPCM for Sub-Nyquist PAL", Oct. 1987.
Patent Abstracts of Japan, vol. 12, No. 13 (E-573) [2860], with respect to JP-A-62 171389 (Jul. 28, 1987), Jan. 14, 1988.
IEEE Transactions on Communications, vol. 25, No. 11, pp. 1295-1302, W. Zschunke, "DPCM Picture Coding with Adaptive Prediction", Nov. 1977.

*Primary Examiner*—Victor R. Kostak
*Attorney, Agent, or Firm*—Fitzpatrick, Cella, Harper & Scinto

[57] ABSTRACT

A predictive coding device comprises sampling circuitry for sub-nyquist sampling a video signal, and predictive coding circuitry for receiving a sampling value from said sampling means and outputting an encoded code. The predictive coding circuitry includes an encoder for encoding a difference between the sampling value and a predicted value corresponding to the sampling value, and outputting the encoded code, and a predictor for generating the predicted value using only an array of pixels in a vertical direction of a screen with respect to a sampling value of a pixel to be encoded by the encoder.

17 Claims, 4 Drawing Sheets

F I G. 11
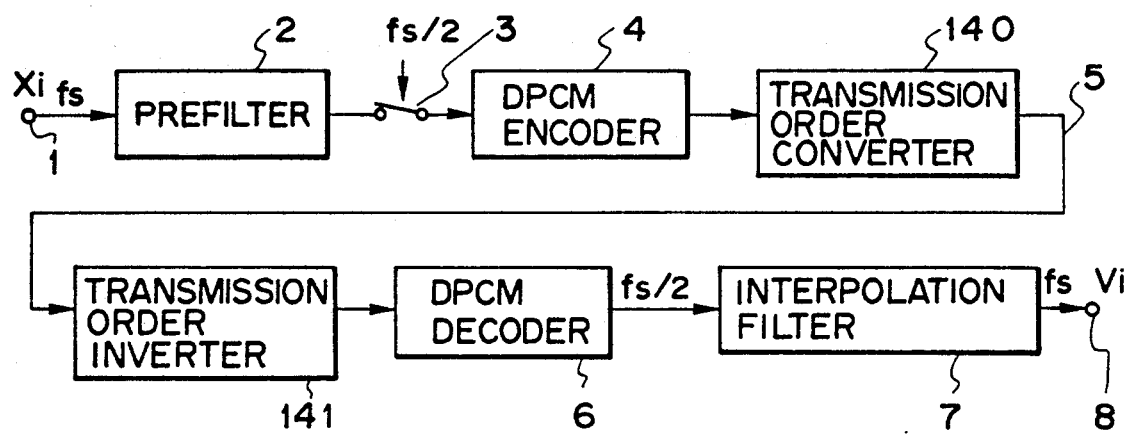
F I G. 12
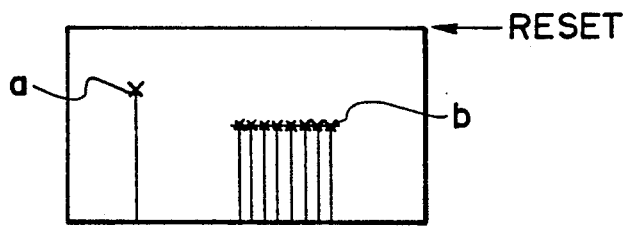
F I G. 13
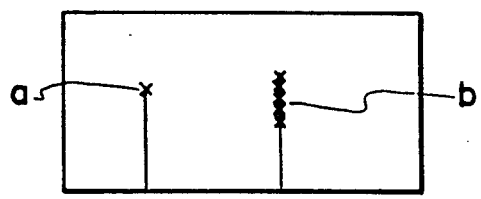

PREDICTIVE CODING DEVICE HAVING A SAMPLING MEANS AND A PREDICTIVE CODING MEANS

BACKGROUND OF THE INVENTION

1. Field of the Invention

The present invention relates to a coding device for encoding a difference between a sampling value and its predicted value.

2. Related Background Art

Upon transmission of digital image or voice information, encoding is performed to reduce a transmission information volume.

As one encoding method, differential pulse code modulation (to be referred to as DPCM hereinafter) is known. In this method, an information volume is compressed by utilizing a correlation between adjacent sampling values. More specifically, an encoded sampling value is temporarily decoded, a predicted value of the next sampling value is obtained using the decoded value, and a difference between this predicted value and an input sampling value is quantized to perform encoding.

FIG. 1 is a block diagram showing an arrangement of a coding device according to the above-mentioned principle. FIG. 2 shows a sampling pattern of a subsampler shown in FIG. 1.

The device shown in FIG. 1 includes an input terminal 1 for receiving input data $X_i$ (e.g., a digital television signal) obtained by sampling a video signal, a prefilter 2 for attenuating a two-dimensional spatial frequency region in the input data $X_i$, a subsampler 3 for performing field-offset subsampling of the output signal from the prefilter 2, a DPCM encoder 4 for performing DPCM of the output signal from the subsampler 3, a transmission path 5, a DPCM decoder 6 for decoding an encoded signal from the DPCM encoder 4, and performing band expansion processing, an interpolation filter 7 for interpolating a signal subjected to expansion processing by the DPCM decoder, and an output terminal 8 for outputting output data $V_i$.

In the above arrangement, the input terminal 1 receives an 8-bit digital television signal. A predetermined two-dimensional spatial frequency region of the digital television signal is attenuated by the prefilter 2. The digital television signal is then subjected to offset subsampling by the subsampler 3. The offset subsampling is executed in accordance with a pattern shown in FIG. 2.

In FIG. 2, solid lines represent scanning lines of a first field, and broken lines represent scanning lines of a second field. Note that an input signal is assumed to be a 2-to-1 interlaced television signal. The television signal is sampled at points indicated by marks "o" and "x" in a matrix, and the subsampler 3 transmits only sampling points (pixels) of the marks "o" (fs is a sampling frequency). In this manner, known field-offset subsampling for extracting pixels in a checkerboard manner is executed, and a receiver side interpolates non-transmitted sampling points using the interpolation filter 7, thereby allowing transmission of a digital signal without decreasing horizontal and vertical resolutions. Although an oblique resolution is degraded, visual characteristics of a person have a lower oblique resolution than the horizontal and vertical resolutions. Thus, such degradation is negligible. Note that the characteristics of the prefilter 2 are designed to attenuate an oblique direction of a spatial frequency, thereby preventing aliasing distortion caused by the above-mentioned subsampling.

A signal subsampled by the subsampler 3, e.g., an 8-bit signal per sampling point (pixel), is compressed to a 4-bit signal by the DPCM encoder 4, and is sent onto the transmission path 5. The 4-bit encoded signal is decoded by the DPCM decoder 6, and is expanded to the original 8-bit signal. Thereafter, the interpolation filter 7 interpolates the sampling points which are not transmitted onto the transmission path 5 and indicated by the marks "x" in FIG. 2 on the basis of the surrounding transmitted sampling points. Interpolated output data $V_i$ are output from the output terminal 8.

The arrangement of the DPCM encoder 4 shown in FIG. 1 will be described below. FIG. 3 is a block diagram showing a conventional arrangement of the DPCM encoder 4. As described above, encoding employs a method of temporarily decoding (locally decoding) an encoded sampling value, obtaining a predicted value of the next sampling value using the decoded value, and quantizing a difference between the predicted value and an actual value to perform encoding.

The encoder 4 includes an input terminal 10 for receiving a sampling value $X_i$, a subtracter 12 for subtracting a predicted value $P_i$ (a decoded value of a previous sampling value) from the sampling value $X_i$, a quantizer 14 for quantizing a difference output from the subtracter 12 and outputting the quantized output as a DPCM code $Y_i$ to an output terminal 16, an inverse quantizer 18 for decoding the DPCM code $Y_i$ to a difference, an adder 20 for adding the predicted value $P_i$ and the output signal from the inverse quantizer 18 to restore the difference to the sampling value, a limiter 22 for limiting the amplitude of the output signal from the adder 20 to a predetermined range to obtain a local decoded value $V_i$, and a D flip-flop 24 for applying the local decoded value $V_i$ output from the limiter 22 to the subtracter 12 as a predicted value $P_{i+1}$ of the next sampling value $X_{i+1}$.

The operation of the DPCM encoder 4 shown in FIG. 3 will be described below.

The subtracter 12 subtracts the predicted value $P_i$ from the sampling value $X_i$ input to the input terminal 10. A difference obtained by this subtraction is quantized by the quantizer 14, and the quantized value is output to the output terminal 16 as the DPCM code $Y_i$. The output from the quantizer 14 is applied to the inverse quantizer 18, so that the DPCM code $Y_i$ is decoded to the difference. The difference is then output to the adder 20. The adder 20 adds the predicted value $P_i$ output from the D flip-flop 24 to the difference. The difference (quantization typical value) is restored to the sampling value (local decoded value). The amplitude of the restored sampling value is limited to a predetermined range by the limiter 22. Thereafter, the sampling value is applied to the D flip-flop 24. The D flip-flop 24 outputs the local decoded value output from the limiter 22 in synchronism with a clock signal, and applies it to the subtracter 12 as the predicted value $P_{i+1}$ of the next sampling value $X_{i+1}$.

In general, a distribution of differences of predicted values is deviated to smaller values. Therefore, when the differences are encoded by nonlinear quantization and the encoded values are transmitted, transmission of compressed information is allowed.

In the conventional coding device described above, a previous value, i.e., a value before an immediately preceding value is used as a predicted value. Therefore, when subsampling is performed, a spatial distance between sampling points is prolonged, and prediction precision is decreased. For this reason, a distortion caused by quantization appears on an image, and this causes degradations such as edge business (image quality degradation at an edge portion), granular noise (noise in a reproduced image in a flat portion), and the like. Thus, high-quality image transmission is difficult to achieve.

In order to solve this problem, so-called two-dimensional prediction for generating a predicted value by utilizing not only sampling values on the same horizontal scanning line but also sampling values on other scanning lines is executed to improve prediction precision.

However, a device for transmitting a differentially encoded code must consider so-called "propagation of errors". Generation of "propagation of errors" is caused by the fact that when an error occurs in a differential code in transmission, not only a value decoded using this differential code but also all the following values decoded using this decoded value become unreliable.

Therefore, in the coding device for performing the above-mentioned two-dimensional prediction, if an error occurs in one decoded value, the error propagates to a plurality of other decoded values. In particular, when a magnetic recording system is assumed to be used as a transmission path, errors often occur in successively transmitted (recorded/reproduced) codes, i.e., so-called burst errors often occur. Since codes are normally transmitted in the raster order, the error in the codes appears as an error in horizontally successive codes. A serious situation may occur wherein most of a screen cannot be reproduced due to propagation of a code error in the vertical direction of the screen.

It is difficult for the coding device for performing the above-mentioned two-dimensional prediction to perform parallel processing for simultaneously encoding a plurality of pixels without decreasing prediction precision. For example, when all the pixels are divided into a plurality of groups in units of pixels or scanning lines and these groups are to be encoded in parallel, a pixel to be encoded and a pixel used for generating a predicted value are separated from each other on the screen, thus considerably decreasing the prediction precision.

For this reason, the coding device for performing such two-dimensional prediction cannot easily achieve high-speed processing, and is not suitable for processing of a digital video signal having a very high bit rate.

SUMMARY OF THE INVENTION

It is an object of the present invention to solve the above-mentioned problems in consideration of the above situation.

It is another object of the present invention to provide a predictive coding device which can perform predictive coding of a subsampled video signal to have high prediction precision and to be free from a distortion.

In order to achieve the above objects, according to one aspect of the present invention, there is provided a predictive coding device comprising:

(a) sampling means for sub-nyquist sampling a video signal; and (b) predictive coding means for receiving a sampling value from the sampling means and outputting an encoded code, the predictive coding means including an encoder for encoding a difference between the sampling value and a predicted value corresponding to the sampling value, and outputting the encoded code, and a predictor for generating the predicted value using only an array of pixels in a vertical direction of a screen with respect to a sampling value of a pixel to be encoded by the encoder.

It is still another object of the present invention to provide a predictive coding device which can improve prediction precision, and can perform high-speed processing with a simple circuit arrangement.

In order to achieve the above object, according to another aspect of the present invention, there is provided a predictive coding device comprising:

(a) sampling means for sub-nyquist sampling a video signal;

(b) parallel conversion means for receiving a sampling value output from the sampling means and outputting in parallel a plurality of sampling values arrayed in a horizontal direction of a screen;

(c) a plurality of predictive coding means for receiving the sampling values output from the sampling means and outputting encoded codes, each of the plurality of predictive coding means including an encoder for encoding a difference between the sampling value and a predicted value corresponding to the sampling value and outputting the encoded code, and a predictor for generating the predicted value using pixels arrayed in a predetermined direction perpendicular to the horizontal direction with respect to a sampling value of a pixel to be encoded by the encoder; and (d) output means for selectively outputting the encoded codes output from the plurality of predictive coding means.

It is still another object of the present invention to provide a predictive coding device which can improve prediction precision, and can minimize propagation of a code error.

In order to achieve the above object, according to still another aspect of the present invention, there is provided a predictive coding device comprising:

(a) sampling means for sub-nyquist sampling a video signal;

(b) predictive coding means for receiving a sampling value output from the sampling means and outputting an encoded code, the predictive coding means including an encoder for encoding a difference between the sampling value and a predicted value corresponding to the sampling value and outputting the encoded code, and a predictor for generating the predicted value using pixels arrayed in a predetermined direction perpendicular to a horizontal direction of the screen with respect to a sampling value of a pixel to be encoded by the encoder; and (c) transmission order conversion means for converting a transmission order of encoded codes output from the predictive coding means from the horizontal direction of the screen to the predetermined direction.

The above and other objects and features of the present invention will become apparent from the following detailed description of the preferred embodiments taken in conjunction with the accompanying drawings.

BRIEF DESCRIPTION OF THE DRAWINGS

FIG. 11 is a block diagram showing an arrangement of a coding device according to still another embodiment of the present invention;

FIG. 12 is a view for explaining propagation of an error when no transmission order inversion is executed in the device shown in FIG. 11; and FIG. 13 is a view for explaining propagation of an error when transmission order inversion is executed in the device shown in FIG. 11.

DETAILED DESCRIPTION OF THE PREFERRED EMBODIMENTS

Figure 3:
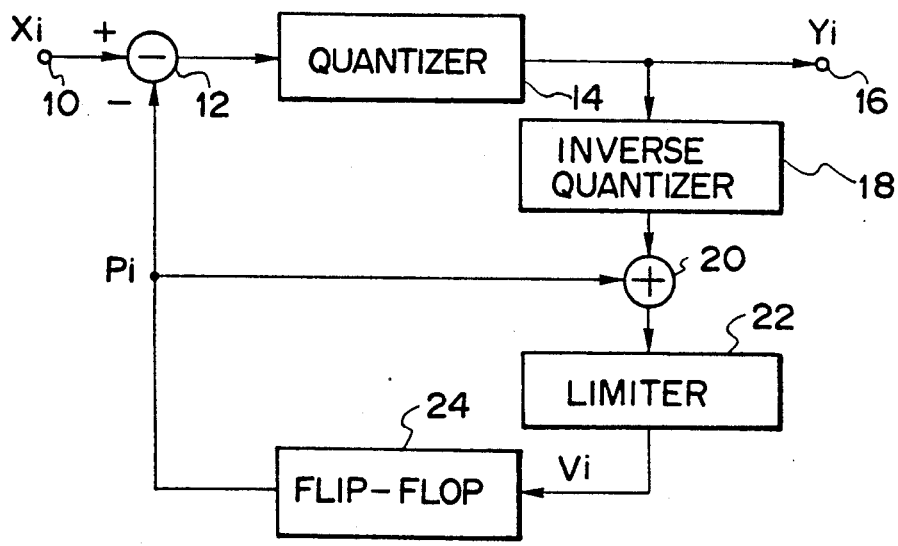
FIG. 3 is a block diagram showing a conventional arrangement of a DPCM encoder.
Figure 4:
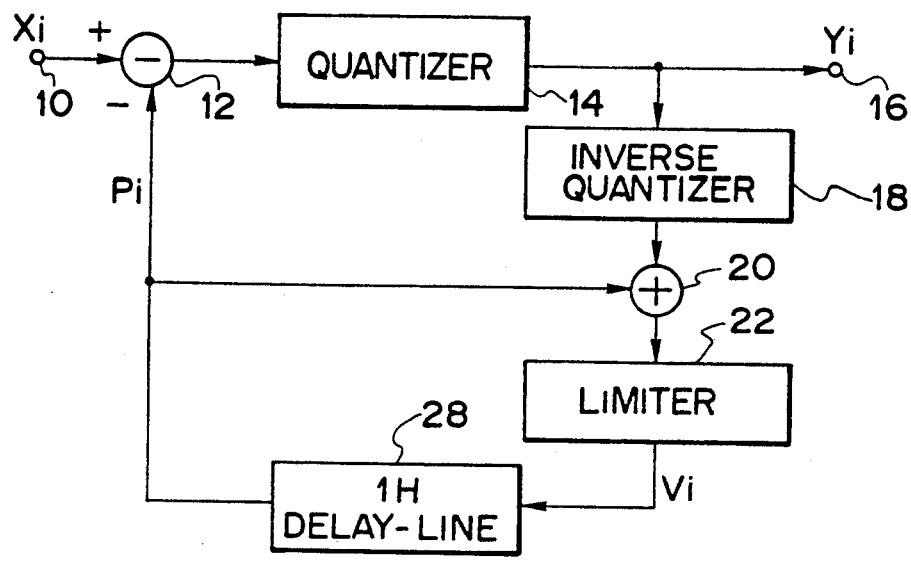
FIG. 4 is a block diagram showing an arrangement of a DPCM encoder in a coding device according to an embodiment of the present invention.

FIG. 4 is a block diagram showing an arrangement of a main part of an embodiment of a coding device according to the present invention. In the device of this embodiment, the encoder shown in FIG. 4 is assembled as the DPCM encoder 4 shown in FIG. 1. The same reference numerals in FIG. 4 denote the same parts as in FIG. 3, and a repetitive description will be avoided.

The characteristic feature of this embodiment is as follows. That is, pixels to be transmitted in respective fields are field-offset subsampled by a subsampler 3 in a matrix. In the encoder shown in FIG. 4, a 1H (one horizontal scanning period) delay line 28 is used in place of the D flip-flop 24 shown in FIG. 3.

The operation of the arrangement shown in FIG. 4 will be described below. In FIG. 4, a process for generating a DPCM code $Y_i$ and decoding an encoded signal using this code is the same as that in FIG. 3, and a description thereof will be omitted.

Figure 5:
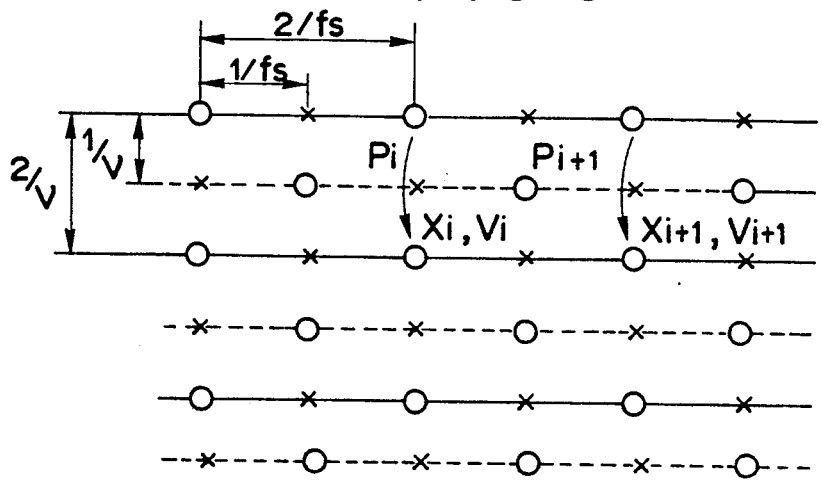
FIG. 5 is a chart for explaining generation of a predicted value in the encoder shown in FIG. 4.

A local decoded value $V_i$ output from a limiter 22 is input to the 1H delay line 28. The 1H delay line 28 delays the local decoded value $V_i$ by one horizontal scanning period, and outputs the delayed value to a subtracter 12 as a predicted value $P_i$. This predicted value $P_i$ is not a previous value but is a sampling point vertically above the present sampling point by one horizontal scanning line on a screen. FIG. 5 is a chart for explaining generation of the predicted value.

Figure 1:
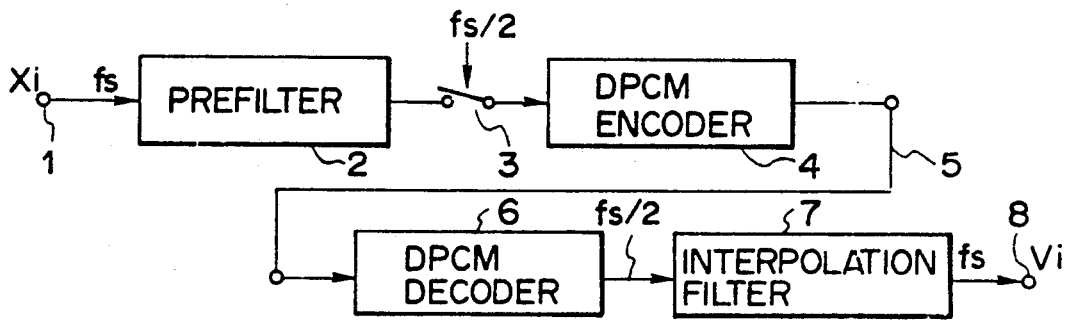
FIG. 1 is a block diagram showing an arrangement of a conventional encoding/decoding device.
Figure 2:
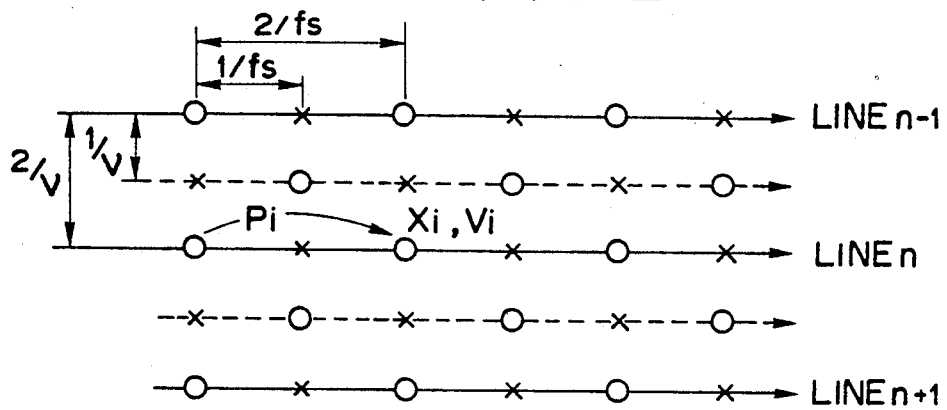
FIG. 2 is a chart showing a sampling pattern of a subsampler shown in FIG. 1.

In the conventional coding device shown in FIGS. 1 to 3, a distance between a sampling value $X_i$ and a predicted value $P_i$ on an image (to be referred to as a prediction distance hereinafter) is 2/fs since a previous value is employed. However, in this embodiment, as shown in FIG. 5, the prediction distance is 2/v. A sampling frequency fs is set to be slightly higher than a frequency twice a transmission bandwidth of a television signal. For example, since a transmission band of an HDTV (high-definition television) signal is 20 MHz, the sampling frequency fs can fall within the range of about 44 MHz to 48 MHz. In general, a transmission band of a television signal is determined by multiplying a so-called Kell factor with a frequency converted in a vertical direction. For the HDTV signal, the Kell factor is about 0.56, and a horizontal sampling point distance 1/fs obtained when the sampling frequency fs is set to be twice the transmission band (40 MHz) is farther than a scanning line distance $1/v$ by $1/0.56 = 1.78$ times. Normally, the sampling frequency fs is set to be 2.2 or more times a transmission band to easily realize a prefilter for A/D-converting a television signal. When the sampling frequency fs is set to be fs = 48 MHz in consideration of this fact, 1/fs is about 1.45 times of 1/v. This ratio corresponds to a ratio of prediction distances of the prior art and this embodiment. Since this embodiment can provide a smaller prediction distance, prediction precision can be improved, and a distortion due to quantization is suppressed, thus achieving high image quality.

Figure 6:
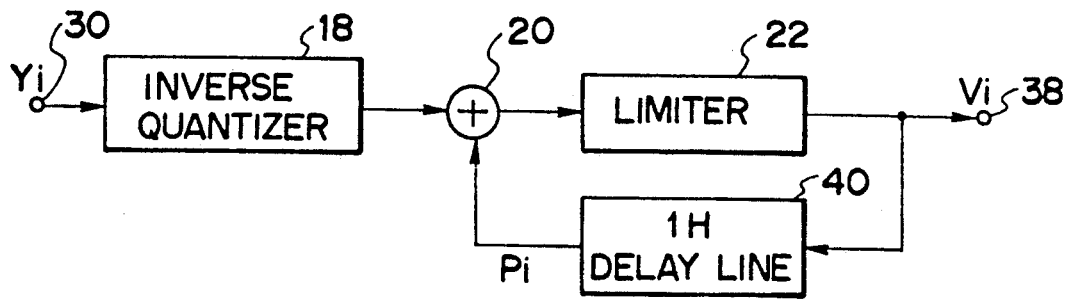
FIG. 6 is a block diagram showing an arrangement of a DPCM decoder corresponding to the encoder shown in FIG. 4.

FIG. 6 is a block diagram showing an arrangement of a DPCM decoder corresponding to the encoder shown in FIG. 4. This decoder is used in place of the DPCM decoder 6 shown in FIG. 1.

The decoder shown in FIG. 6 includes an input terminal 30 for receiving a DPCM code $Y_i$, an inverse quantizer 18 for decoding the DPCM code $Y_i$ to a difference, an adder 20 for adding a predicted value $P_i$ to a decoded difference to restore an image, a limiter 22 for limiting the output amplitude of the output signal from the adder 20 to a predetermined range and outputting the limited signal as a decoded image signal $V_i$, an output terminal 38 for outputting the decoded image signal $V_i$, and a 1H delay line 40 for obtaining a predicted value $P_i$.

In the DPCM decoder with this arrangement, a 4-bit DPCM code input from the input terminal 30 is decoded to a difference (quantization typical value) by the inverse quantizer 18. The difference is added to a predicted value $P_i$ by the adder 20 to restore an original image signal. The output amplitude of the output from the adder 20 is limited by the limiter 22 to a predetermined range, and the limited signal is output as a decoded image signal $V_i$. The signal $V_i$ is also applied to the 1H delay line 40. The 1H delay line 40 delays the decoded image signal $V_i$ by 1H, thereby generating the predicted value $P_i$.

Figure 7:
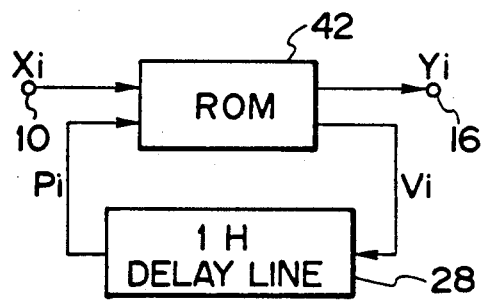
FIG. 7 is a block diagram showing another arrangement of the DPCM encoder shown in FIG. 4.

FIG. 7 is a block diagram showing another embodiment of an encoder according to the present invention. The same reference numerals in FIG. 7 denote the same parts as in FIG. 1, and a repetitive description thereof will be omitted. In FIG. 1, subtraction, quantization, addition, and limiter processing operations are separately executed, while this embodiment uses a ROM 42 storing a table describing a relationship of a DPCM code $Y_i$ and a local decoded value $V_i$ with respect to a sampling value $X_i$ and a predicted value $P_i$. A 1H delay line 28 receives the local decoded value $V_i$ output from the ROM 42. In this case, a possible range of $(X_i-P_i)$ is restricted by the value of the local decoded value $V_i$. By utilizing this, a sliding quantizer for decreasing a quantization step width by changing quantization characteristics by the predicted value $P_i$ can be constituted. Therefore, higher image quality than the arrangement using the encoder shown in FIG. 4 can be attained.

The operation principle of the embodiment using the encoder shown in FIG. 7 is the same as that of the above embodiment, and a description thereof will be omitted. Since the encoder of this embodiment can be constituted without using separate circuits, the arrangement can be simplified, and the number of components can be decreased, resulting in a compact, lightweight device.

Figure 8:
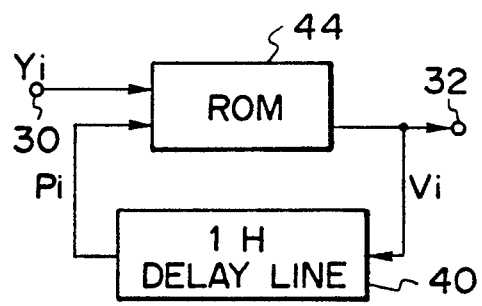
FIG. 8 is a block diagram showing another arrangement of the DPCM decoder shown in FIG. 6.

FIG. 8 is a block diagram showing another embodiment of the DPCM decoder. In the arrangement shown in FIG. 6, inverse quantization, addition, and limiter processing operations are separately executed. However, this embodiment employs a ROM 44 storing a table describing the relationship of a local decoded value $V_i$ with respect to a DPCM code $Y_i$ and a predicted value $P_i$. A local decoded value $V_i$ output from the ROM 44 is applied to the 1H delay line 40. In this case, a sliding quantizer corresponding to the encoder shown in FIG. 7 can be similarly constituted. With this arrangement, since the decoder can be constituted without using separate circuits, the arrangement can be simplified and the number of components can be decreased. As a result, still higher image quality can be achieved in combination with the encoder shown in FIG. 7.

According to the coding device with the above arrangement, since pixels in the fields are sampled in a matrix, two pixels to be transmitted on two adjacent horizontal scanning lines are arranged to be very close to each other. Since only sampling values adjacent in the vertical direction of the screen are used to generate a predicted value, a distance on a screen between a pixel to be encoded and a pixel used for generating a predicted value can be very small. As a result, prediction precision can be improved, and a distortion due to quantization can be decreased. Since vertically adjacent pixels are simply used to generate a predicted value, the arrangement will not be complicated.

Figure 9:
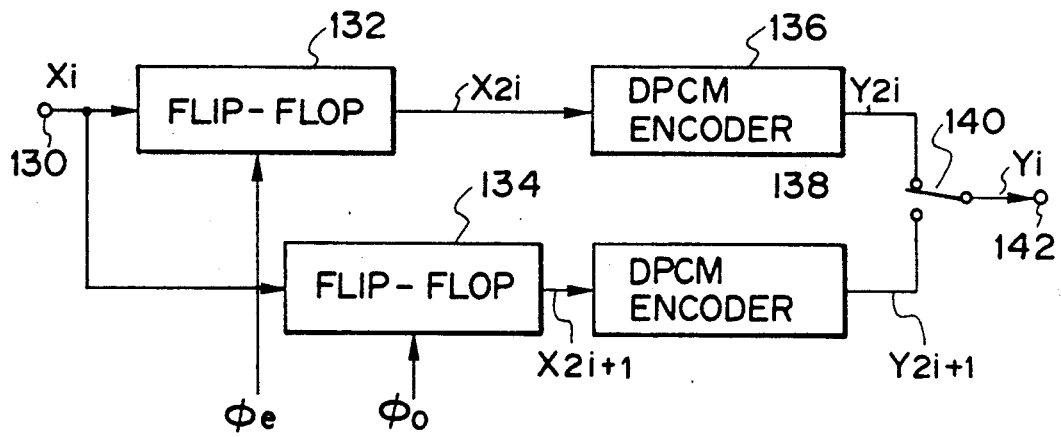
FIG. 9 is a block diagram showing a main part of a coding device according to another embodiment of the present invention.

FIG. 9 is a block diagram showing an arrangement of a main part of a coding device according to still another embodiment of the present invention. In this embodiment, an encoder shown in FIG. 9 is assembled in place of the DPCM encoder 4 shown in FIG. 1.

The encoder shown in FIG. 9 includes an image input terminal 130 for receiving a sampling value $X_i$, a D flip-flop 132 for receiving a sampling value $X_i$ as a D terminal input, and $\phi_e$ as a clock signal, a D flip-flop 134 for receiving the sampling value $X_i$ as a D terminal input, and $\phi_o$ as a clock signal, a DPCM encoder 136 for receiving an output signal from the D flip-flop 132, a DPCM encoder 138 for receiving an output signal from the D flip-flop 134, a switch 140 for selectively outputting one of the outputs from the DPCM encoders 136 and 138, and an output terminal 142.

The operation of this embodiment with the above arrangement will be described below.

A sampling value $X_i$ input to the image input terminal 130 is applied to the D flip-flops 132 and 134. The D flip-flop 132 is triggered by the clock signal $\phi_e$ synchronous with an input timing of an even-numbered pixel, and the D flip-flop 134 is triggered by the clock signal $\phi_o$ synchronous with an input timing of an odd-numbered pixel. Thus, the sampling value $X_i$ is divided into an even-numbered pixel $X_{2i}$ and an odd-numbered pixel $X_{2i+1}$.

The divided sampling values $X_i$ are applied to the DPCM encoders 136 and 138, and encoding operations are executed in parallel. If the DPCM encoders 136 and 138 perform prediction only in the vertical direction, as will be described later, horizontal pixels are subjected to independent processing operations. A signal $Y_{2i}$ output from the DPCM encoder 136, and a signal $Y_{2i-1}$ output from the DPCM encoder 138 are selected by the switch 140 to be converted to a serial signal. Thus, an output signal $Y_i$ is output to the output terminal 142.

With the above arrangements, a processing speed of the DPCM encoders 136 and 138 is doubled. As a result, a signal having a high frequency twice that in a case using one DPCM encoder shown in FIG. 1 can be processed without decreasing prediction precision.

Figure 10:
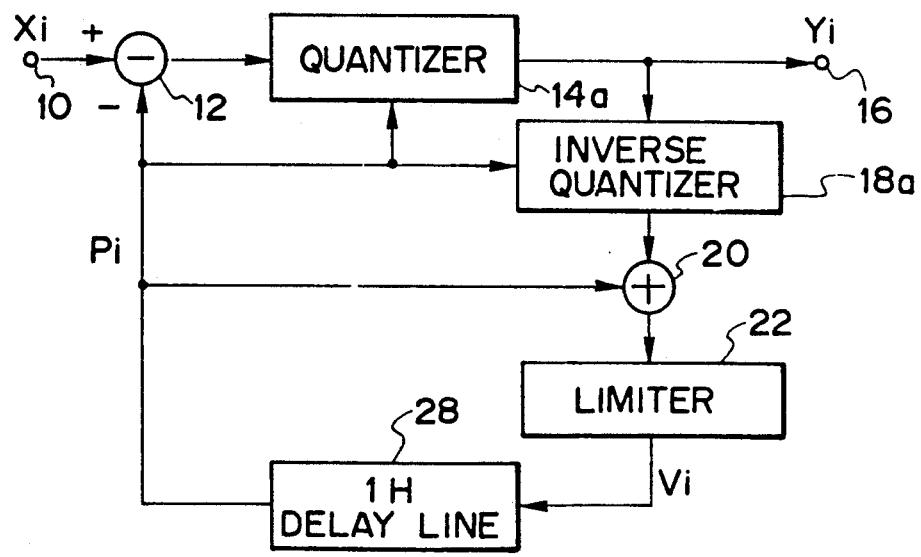
FIG. 10 is a block diagram showing an arrangement of a DPCM encoder shown in FIG. 9.

The DPCM encoder shown in FIG. 4 can be applied to the DPCM encoders 136 and 138 shown in FIG. 9. Since a processing speed of each DPCM encoder can be decreased, a DPCM encoder shown in FIG. 10 can be effectively used. The same reference numerals in FIG. 10 denote the same parts as in FIG. 4.

A range of an input (difference) to a quantizer 14a is limited to a range of $255-P_i$ to $0-P_i$ (when a sampling value $X_i$ is quantized by 8 bits) if a predicted value $P_i$ is known. Therefore, the characteristics of the quantizer 14a and an inverse quantizer 18a can be optimized according to the value of the predicted value $P_i$ within a range at that time, and hence, a sliding quantizer can be constituted. As a result, a quantization step can be halved, and high-quality coding free from quantization noise can be achieved.

According to the coding device with the above arrangement, a pixel used for generating a predicted value can be arbitrarily selected, and a predicted value can be generated by utilizing a sampling value of a pixel closest to a pixel corresponding to an input sampling value. In other words, since a distance between the input sampling value and the predicted value can be shortened, prediction precision can be improved. Since horizontal arrays of a plurality of pixels are processed by separate encoders, parallel encoding operations are allowed. Therefore, a high-frequency signal can be encoded at a speed corresponding to an integer multiple of a processing speed of each encoder.

FIG. 11 is a block diagram showing an arrangement of a coding device according to still another embodiment of the present invention. The same reference numerals in FIG. 11 denote the same parts.

The characteristic feature of this embodiment is that a transmission order converter 140 and a transmission order inverter 141 are arranged between a DPCM encoder 4 and a DPCM decoder 6.

The transmission order converter 140 has a function of converting a transmission order from the horizontal direction to the vertical direction, and the transmission order inverter 141 has a function of converting the transmission order of signals from the transmission order converter 140 from the vertical direction to the horizontal direction.

In this embodiment, the DPCM encoder 4 shown in FIG. 4 is used, and the DPCM decoder 6 shown in FIG. 6 is used.

However, the DPCM encoder 4 shown in FIG. 4 performs prediction in the vertical direction, and outputs a signal in the horizontal direction (raster scanning direction). When prediction is performed in the vertical direction, if a transmission error occurs on the transmission path, propagation of an error occurs in the vertical direction of the screen. In particular, when a perfect integration local decoder having a prediction coefficient of 1 is used, propagation of an error continues until the local decoder is reset (e.g., by resetting the content of a 1H delay line 26 in a vertical blanking period.)

When this resetting method is used, an error occurring on the screen propagates to the lower end of the screen.

As shown in FIG. 12, for example, when a random error a occurs, the error propagates as illustrated. In a system for recording/reproducing data on/from a magnetic tape as a transmission path, a code error may frequently occur in successively transmitted codes. When a code is transmitted in the horizontal direction of the screen, burst errors b in FIG. 12 easily occur. The burst errors b become horizontally successive code errors and each error propagates in the vertical direction. Therefore, the burst errors appear as an error over a wide area, resulting in very poor appearance. Meanwhile, the random error a can be detected by a given method, e.g., parity check, and right and left pixels of the line including the error can be interpolated to correct the error. However, it is impossible to eliminate image degradation caused by the burst errors b by the above correction method.

In this embodiment, as shown in FIG. 11, the transmission order converter 140 and the transmission order inverter 141 are arranged to eliminate an adverse influence of propagation of an error on an image according to the burst errors occurring on the transmission path, thereby minimizing image quality degradation. This countermeasure against propagation of an error and improvement of prediction precision by the DPCM encoder 4 allow very high-quality image transmission.

A DPCM code $Y_i$ output from the DPCM encoder 4 is input to the transmission order converter 140. The transmission order converter 140 comprises a memory having a capacity of one or more frames. The converter 140 temporarily stores one frame of the input DPCM codes $Y_i$. Thereafter, the codes stored in the converter 140 are read out in the vertical direction of the screen, and are supplied onto the transmission path 5. With this operation, the transmission order of the DPCM codes $Y_i$ is converted from the horizontal direction to the vertical direction.

The horizontal/vertical-converted DPCM codes $Y_i$ are supplied to the transmission order inverter 141 through the transmission path 5. The transmission order inverter 141 converts the transmission order of the input signals from the vertical direction to the horizontal direction, and supplies the converted signals to the DPCM decoder 6. The output signals from the transmission order inverter 141 are expanded to 8-bit signals by the DPCM decoder 6, and non-transmitted sampling points are interpolated by the interpolation filter 7, thus restoring original signals. The original signals are then output to the output terminal 8.

FIG. 13 is a view for explaining an error state on the screen in this embodiment when a transmission error occurs. As can be seen from FIG. 13, according to this embodiment, propagation of an error caused by a random error a similarly occurs as in the prior art. However, burst errors b are successively arrayed in a transmission direction, i.e., the vertical direction of the screen. For example, propagation of an error linearly occurs in the vertical direction, and interpolation can be performed using right and left pixels as in the case of the random error a. Thus, degradation of image quality can be eliminated.

In the above embodiments, a video signal is subjected to field-offset subsampling, so that sampling points in the fields are arranged in a matrix. Therefore, a predicted value is generated using vertically adjacent pixels on the screen. When a video signal is subjected to line-offset subsampling, most adjacent pixels on the screen are obliquely arranged. In this case, a predicted value is generated using a sampling value corresponding to a pixel obliquely above a pixel to be encoded, thus improving prediction precision. In addition, the transmission order of codes is converted in an oblique direction of the screen, so that the adverse influence of propagation of an error caused by burst errors on a reproduced image can be minimized.

According to the coding device with the above arrangement, a pixel used to generate a predicted value can be arbitrarily selected, and a predicted value can be generated by utilizing a sampling value of a pixel most adjacent to a pixel corresponding to an input sampling value. In other words, since a distance on an image between an input sampling point and a predicted value can be shortened, prediction precision can be improved. When the transmission order of differential codes output from the encoder is converted to a correlation direction utilized upon generation of a predicted value, propagation of an error can be limited to a line in the transmission direction of codes on the screen. Thus, a situation in which most of the screen cannot be reproduced will not occur.

What is claimed is:

1. A predictive coding device comprising:
   input means for inputting a video signal which includes sampled values in an order according to a raster scanning;
   sub-sampling means for sub-sampling the video signal input by said input means, pixels sub-sampled by said sub-sampling means in adjacent horizontal lines of the same field being arrayed along lines of a vertical direction of a screen; and
   predictive coding means for receiving a sub-sampling value from said sub-sampling means and outputting an encoded code,
   said predictive coding means including an encoder for encoding a difference between the sub-sampling value and a predicted value corresponding to the sub-sampling value, and outputting the encoded code, and a predictor for generating the predicted value using only an array of pixels in a vertical direction of a screen with respect to a sub-sampling value of a pixel to be encoded by said encoder.

2. A device according to claim 1, wherein said encoder includes:
   a calculator for calculating the difference between the sub-sampling value and the predicted value corresponding to the sub-sampling value;
   a quantizer for nonlinearly quantizing the difference and outputting the encoded code;
   an inverse quantizer, having characteristics opposite to those of said quantizer, for receiving the encoded code, and outputting a quantization typical value; and
   an adder for adding the quantization typical value and the predicted value and outputting a local decoded value to said predictor.

3. A device according to claim 1, wherein said encoder includes a memory for outputting the encoded code obtained by nonlinearly quantizing the difference between the sub-sampling value and the predicted value corresponding to the sub-sampling value and a local decoded value corresponding to the encoded code from addresses corresponding to the sub-sampling value and the predicted value corresponding to the sub-sampling value.

4. A device according to claim 1, wherein said predictor includes delay means having a delay time corresponding to one horizontal scanning period of the video signal.

5. A device according to claim 1, wherein said encoder switches encoding characteristics according to the predicted value.

6. A device according to claim 1, further comprising transmission order converter means for converting a transmission order of encoded codes output from said predictive coding means from a horizontal direction to the vertical direction of a screen.

7. A device according to claim 1, wherein said predictive coding means includes:
   a parallel circuit for receiving the sub-sampling value output from said sub-sampling means and outputting in parallel a plurality of sub-sampling values arrayed in a horizontal direction of a screen; and
   a plurality of predictive encoders for receiving the sub-sampling values output from said sub-sampling means and outputting encoded codes.

8. A device according to claim 7, wherein said predictive coding means further includes an output circuit for selectively outputting the encoded codes output from said plurality of predictive encoders.

9. A predictive coding device comprising:
   (a) sampling means for sub-nyquist sampling a video signal;
   (b) parallel conversion means for receiving a sampling value output from said sampling means and parallelly outputting a plurality of sampling values arrayed in a horizontal direction of a screen;
   (c) a plurality of predictive coding means for receiving the sampling values output from said sampling means and outputting encoded codes,
      each of said plurality of predictive coding means including an encoder for encoding a difference between the sampling value and a predicted value corresponding to the sampling value and outputting the encoded code, and a predictor for generating the predicted value using pixels arrayed in a predetermined direction perpendicular to the horizontal direction with respect to a sampling value of a pixel to be encoded by said encoder; and
   (d) output means for selectively outputting the encoded codes output from said plurality of predictive coding means.

10. A device according to claim 9, wherein said encoder switches coding characteristics according to the predicted value.

11. A device according to claim 10, wherein said encoder includes:
   a calculator for calculating the difference between the sampling value and the predicted value corresponding to the sampling value,
   a quantizer for nonlinearly quantizing the difference and outputting the encoded code,
   an inverse quantizer, having characteristics opposite to those of said quantizer, for receiving the encoded code, and outputting a quantization typical value, and
   an adder for adding the quantization typical value and the predicted value and outputting a local decoded value to said predictor; and
   said encoder switches quantization characteristics of said quantizer and said inverse quantizer in accordance with the predicted value.

12. A device according to claim 9, wherein said predictor generates the predicted value using only pixels arrayed in a vertical direction of the screen with respect to a sampling value of a pixel to be encoded by said encoder.

13. A device according to claim 12, wherein said predictor includes delay means having a delay time corresponding to one horizontal scanning period of the video signal.

14. A predictive coding device comprising:
   (a) sampling means for sub-nyquist sampling a video signal;
   (b) predictive coding means for receiving a sampling value output from said sampling means and outputting an encoded code,
      said predictive coding means including an encoder for encoding a difference between the sampling value and a predicted value corresponding to the sampling value and outputting the encoded code, and a predictor for generating the predicted value using pixels arrayed in a predetermined direction perpendicular to a horizontal direction of the screen with respect to a sampling value of a pixel to be encoded by said encoder; and
   (c) transmission order conversion means for converting a transmission order of encoded codes output from said predictive coding means from the horizontal direction of the screen to the predetermined direction.

15. A device according to claim 14, wherein said predictor generates the predicted value using only pixels arrayed in a vertical direction of the screen with respect to a sampling value of a pixel to be encoded by said encoder, and said transmission order conversion means converts the transmission order of the encoded codes output from said predictive coding means from the horizontal direction to the vertical direction of the screen.

16. A device according to claim 15, wherein said predictor includes delay means having a delay time corresponding to one horizontal scanning period of the video signal.

17. A device according to claim 14, wherein said encoder includes:
   a calculator for calculating the difference between the sampling value and the predicted value corresponding to the sampling value;
   a quantizer for nonlinearly quantizing the difference and outputting the encoded code;
   an inverse quantizer, having characteristics opposite to those of said quantizer, for receiving the encoded code, and outputting a quantization typical value; and
   an adder for adding the quantization typical value and the predicted value and outputting a local decoded value to said predictor.

* * * * *

UNITED STATES PATENT AND TRADEMARK OFFICE
CERTIFICATE OF CORRECTION

PATENT NO. : 5,111,293
DATED : May 5, 1992
INVENTOR(S) : Shinichi Yamashita

It is certified that error appears in the above-identified patent and that said Letters Patent is hereby corrected as shown below:

Title page, item [56]:
REFERENCES CITED

U.S. Patent Documents, "4,893,467" should read --4,843,467--.

Signed and Sealed this

Twentieth Day of July, 1993

Attest:

MICHAEL K. KIRK

Attesting Officer

Acting Commissioner of Patents and Trademarks